United States Patent
Yoon et al.

[11] Patent Number: 5,368,764
[45] Date of Patent: Nov. 29, 1994

[54] MN-ZN-BASED SINGLE CRYSTAL FERRITE COMPOSITION

[75] Inventors: Jung S. Yoon; Won H. Rhee; Jae H. Koh, all of Kyungki-Do; Woo S. Jang, Seoul, all of Rep. of Korea

[73] Assignee: Goldstar Co., Ltd., Rep. of Korea

[21] Appl. No.: 221,405

[22] Filed: Mar. 31, 1994

[30] Foreign Application Priority Data

Mar. 31, 1993 [KR] Rep. of Korea .................. 1993-5291

[51] Int. Cl.⁵ .............................................. C04B 35/38
[52] U.S. Cl. .............................. 252/62.59; 252/62.62; 252/62.63
[58] Field of Search ................ 252/62.59, 62.62, 62.63

[56] References Cited

U.S. PATENT DOCUMENTS

| | | | |
|---|---|---|---|
| 3,574,116 | 4/1971 | Sugano et al. | 252/62.59 |
| 3,769,219 | 10/1973 | Sugano et al. | 252/62.59 |
| 4,285,894 | 8/1981 | Watanabe et al. | 252/62.59 |
| 4,439,794 | 3/1984 | Shiroishi et al. | 252/62.59 |

FOREIGN PATENT DOCUMENTS

| | | | |
|---|---|---|---|
| 56-32399 | 4/1981 | Japan | 252/62.59 |
| 63-222097 | 9/1988 | Japan | 252/62.59 |

*Primary Examiner*—Jack Cooper
*Attorney, Agent, or Firm*—Ostrolenk, Faber, Gerb & Soffen

[57] ABSTRACT

An Mn-Zn-based single crystal ferrite composition containing an additive material essentially consisting of 0.2 to 2 mole % $SnO_2$, 0.1 to 1 mole % CoO, 0.2 to 1 mole % $CaCO_3$ and 0.02 to 1 weight % $V_2O_5$ added to a host material essentially consisting of 51 to 54 mole % $Fe_2O_3$, 27 to 33 mole % MnO and 16 to 20 mole % ZnO. A magnetic head manufactured from the single crystal ferrite generates an enhanced reproduction output and a reduced rubbing noise, thereby achieving a high picture quality and a high resolution of images.

1 Claim, 5 Drawing Sheets

MN-ZN-BASED SINGLE CRYSTAL FERRITE COMPOSITION

BACKGROUND OF THE INVENTION

Field of the Invention

The present invention relates to a single crystal ferrite composition suitable for magnetic heads used in record and reproduction of images in video cassette recorder (VCR) systems, and more particularly to an Mn-Zn-based single crystal ferrite composition capable of achieving a high picture quality and a high resolution of images in a high frequency region of 7 to 8 MHz.

Description of the Prior Art

Generally, Mn-Zn-based single ferrite materials exhibit a high specific resistivity, a high initial magnetic permeability, and a high wear resistance. Moreover, they have an advantage of a high saturated magnetic flux density. By virtue of such advantageous properties, Mn-Zn-based single ferrite materials have been mainly used for fabrication of magnetic heads used in record and reproduction of images in VCR systems.

Where magnetic heads made of such conventional Mn-Zn-based single crystal ferrite materials are used in lower-grade VCR systems in which a high picture quality and a high resolution are not required, they could perform their functions sufficiently in a frequency range of 4 to 5 MHz.

Recently, however, demand for higher picture quality and higher resolution has been increased. The existing magnetic heads equipped in the lower-grade VCR systems could not satisfy such a demand.

For this reason, there have recently been made developments of new image-recording and reproducing magnetic heads exhibiting a high initial magnetic permeability in the frequency range of 7 to 8 MHz and a reduced rubbing noise so as to satisfy the demand for higher picture quality and higher resolution.

Now, manufacture of an existing Mn-Zn-based single crystal material and fabrication of an image-recording and reproducing magnetic head using the Mn-Zn-based single crystal material will be described.

At a first step $S_1$, ferric oxide ($Fe_2O_3$), manganese oxide (MnO) and zinc oxide (ZnO) are prepared in the form of powder and then mixed together to obtain a basic composition of Mn-Zn-based single crystal ferrite.

In the basic composition, $Fe_2O_3$, MnO and ZnO have contents of 51 to 54 mole %, 27 to 33 mole %, and 16 to 20 mole %, respectively.

Upon mixing, other materials than $Fe_2O_3$, MnO and ZnO are not added optionally.

The following description will be made in conjunction with a composition essentially consisting of 53 mole % $Fe_2O_3$, 28 mole % MnO and 19 mole % ZnO, for the simplicity of the description.

At a second step $S_2$, the composition is subjected to a homogeneous blending using a wet ball milling process. By the homogeneous blending, $Fe_2O_3$, MnO and ZnO of the composition are in the form of slurry.

The resultant slurry is then dried using a spray dry process at a third step $S_3$, thereby producing powder.

At a fourth step $S_4$, the powder is sintered at a temperature of 1,300° C. for 4 hours.

The resultant sintered body is then grown on a <100> oriented single crystal seed using the vertical Bridgeman process at a fifth step $S_5$. By this growth, an Mn-Zn-based single crystal ferrite ingot is obtained.

At a sixth step $S_6$, the leading end of the ingot is cut. Thereafter, the cut surface of the ingot is subjected to an etching using an HCl solution. The orientation of the etched surface of the ingot is then determined by use of a measuring device using He laser.

At a seventh step $S_7$, the ingot subjected to the orientation measurement is cut to obtain blocks having a thickness of 1.6 cm. Then, each block is cut to obtain wafers having a thickness of 1 mm. Each wafer obtained is subjected to the measurement of specific resistivity using a 4-point probe measuring process.

From the wafers, toroidal samples each having an inner diameter of 5 mm, an outer diameter of 8 mm and a thickness of 0.5 mm are formed at an eighth step $S_8$. The toroidal samples are subjected to measurements of the saturated magnetic flux density $B_{10}$, the initial magnetic permeability $\mu i$ and the temperature dependency to the magnetic permeability $\mu$. The results will be described in conjunction with Tables 1 and 2.

As shown in Table 1, the saturated magnetic flux density $B_{10}$ of 4,200 to 5,000G is exhibited in the toroidal sample obtained in the case where the Mn-Zn-based single crystal ferrite contains a basic composition essentially consisting of 51 to 54 mole % $Fe_2O_3$, 27 to 33 mole % MnO and 16 to 20 mole % ZnO without any additional elements. In this case, the toroidal sample also exhibits the initial magnetic permeability $\mu i$ of 200 to 330 at the frequency of 7 MHz. On the other hand, the temperature $T_{\mu 2p}$ corresponding to a secondary peak of magnetic permeability $\mu$ is ranged from 0° to 50° C. at the frequency of 0.5 MHz.

In particular, where the Mn-Zn-based single crystal ferrite contains a basic composition essentially consisting of 53 mole % $Fe_2O_3$, 28 mole % MnO and 19 mole % ZnO without any additional elements, the toroidal sample obtained from this single crystal ferrite exhibits the saturated magnetic flux density $B_{10}$ of 4,900G and the initial magnetic permeability $\mu i$ of 300 at the frequency of 7 MHz, as shown in Table 2. In this case, the temperature $T_{\mu 2p}$ corresponding to the secondary peak of magnetic permeability $\mu$ is 20° C. at the frequency of 0.5 MHz.

Using the Mn-Zn-based single crystal ferrite, an image-recording and reproducing magnetic head having a construction shown in FIG. 5 is fabricated at a ninth step $S_9$. The magnetic head has a gap G of 0.37 mm and a track pitch of 31 $\mu$m. In FIG. 5, the reference numeral 211 denotes a contact surface of the magnetic head to be in contact with a magnetic tape.

Finally, the magnetic head is subjected to measurements of the reproduction output and the rubbing noise at a tenth step $S_{10}$. The results are shown in Tables 1 and 2.

As shown in Table 1, the reproduction output of 17 to 220 $\mu$V and the rubbing noise of 5 to 8 dB are measured in the magnetic head obtained in the case where the Mn-Zn-based single crystal ferrite contains a basic composition essentially consisting of 51 to 54 mole % $Fe_2O_3$, 27 to 33 mole % MnO and 16 to 20 mole % ZnO without any additional elements. In particular, where the Mn-Zn-based single crystal ferrite contains a basic composition essentially consisting of 53 mole % $Fe_2O_3$, 28 mole % MnO and 19 mole % ZnO without any additional elements, the resultant magnetic head generates the reproduction output of 190 $\mu$V and the rubbing noise of 6 dB, as shown in Table 2.

The rubbing noise generated from the magnetic head, namely, the value of 5 to 8 dB shown in Table 1 is considered as being relatively high. Such a high rubbing noise is caused by the fact that the magnetic domain of a magnetic tape being in contact with the magnetic head is easily varied due to its unstably fixed condition.

Since the conventional magnetic head exhibits a relatively low initial magnetic permeability and a relatively high rubbing noise at the frequency of 7 to 8 MHz, it is unsuitable as a magnetic head for high-grade 8 mm camcorders and super VHS VCRs widely used at present.

SUMMARY OF THE INVENTION

Therefore, an object of the invention is to provide an Mn-Zn-based single crystal ferrite composition capable of obtaining a relatively high initial magnetic permeability and yet generating a relatively low rubbing noise at the high frequency range.

In accordance with the present invention, this object can be accomplished by providing an Mn-Zn-based single crystal ferrite composition containing a host material essentially consisting of 51 to 54 mole % $Fe_2O_3$, 27 to 33 mole % MnO and 16 to 20 mole % ZnO, and an additive material essentially consisting of 0.2 to 2 mole % $SnO_2$, 0.1 to 1 mole % CoO, 0.2 to 1 mole % $CaCO_3$ and 0.02 to 1 weight % $V_2O_5$.

BRIEF DESCRIPTION OF THE DRAWINGS

These and other objects, features and advantages of the invention will become more apparent upon a reading of the following detailed specification and drawings, in which.

DETAILED DESCRIPTION OF THE PREFERRED EMBODIMENT

The present invention provides an Mn-Zn-based single crystal ferrite composition suitable for magnetic heads used in record and reproduction of images in VCR systems. The composition contains a host material essentially consisting of 51 to 54 mole % $Fe_2O_3$, 27 to 33 mole % MnO and 16 to 20 mole % ZnO, and an additive material essentially consisting of 0.2 to 2 mole % $SnO_2$, 0.1 to 1 mole % CoO, 0.2 to 1 mole % $CaCO_3$ and 0.02 to 1 weight % $V_2O_5$.

Figure 1:
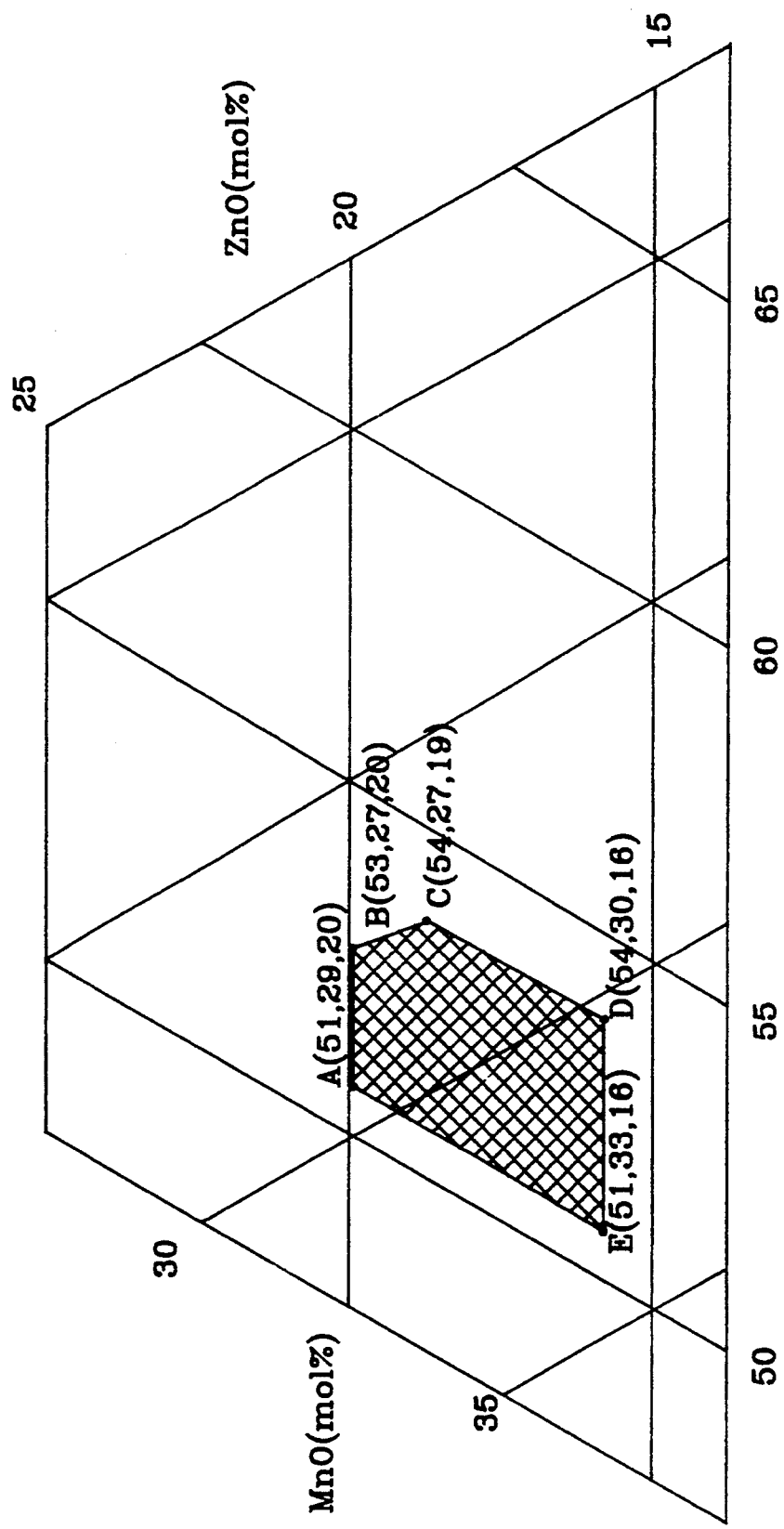
FIG. 1 is a diagram for determining a basic composition of an Mn-Zn-based single crystal ferrite in accordance with the present invention.

The composition range of the host material, namely, the basic composition range of the single crystal ferrite in accordance with the present invention can be defined using an $Fe_2O_3$-MnO-ZnO composition diagram shown in FIG. 1.

For defining the composition ranges of $Fe_2O_3$, MnO and ZnO of the host material, five coordinate points A, B, C, D and E on the composition diagram are determined. The coordinate point A corresponds to a composition containing 51 mole % $Fe_2O_3$, 29 mole % MnO and 20 mole % ZnO. The coordinate point B corresponds to a composition containing 53 mole % $Fe_2O_3$, 27 mole % MnO and 20 mole % ZnO. The coordinate point C corresponds to a composition containing 54 mole % $Fe_2O_3$, 27 mole % MnO and 19 mole % ZnO. The coordinate point D corresponds to a composition containing 54 mole % $Fe_2O_3$, 30 mole % MnO and 16 mole % ZnO. Finally, the coordinate point E corresponds to a composition containing 51 mole % $Fe_2O_3$, 33 mole % MnO and 16 mole % ZnO.

The composition of the host material, namely, the basic composition essentially consisting of $Fe_2O_3$, MnO and ZnO is ranged in a pentagonal region defined by five solid lines respectively connecting neighboring coordinate points A and B, B and C, C and D, D and E, and E and A. Where 0.2 to 2 mole % $SnO_2$, 0.2 to 1 mole % CoO, 0.2 to 1 mole % $CaCO_3$ and 0.02 to 1 weight % $V_2O_5$ are added as an additive material near a coordinate point corresponding to a composition containing 53 mole % $Fe_2O_3$, 28 mole % MnO and 19 mole % ZnO, a superior magnetic head characteristic can be obtained.

The present invention will be understood more readily with reference to the following examples; however these examples are intended to illustrate the invention and are not to be construed to limit the scope of the present invention.

EXAMPLE 1

At a first step $S_{11}$, 53 mole % $Fe_2O_3$, 28 mole % MnO and 19 mole % ZnO, 0.5 mole % $SnO_2$, 0.5 mole % CoO, 0.5 mole % $CaCO_3$ and 0.02 weight % $V_2O_5$ were prepared in the form of powder and then mixed together to obtain a composition of Mn-Zn-based single crystal ferrite.

Thereafter, the same procedures as those of the second to eighth steps of the conventional method have been performed to obtain a toroidal sample at a second step $S_{12}$. The toroidal sample was then subjected to measurements of the specific resistivity, the saturated magnetic flux density $B_{10}$, the initial magnetic permeability $\mu i$ and the temperature $T_{\mu 2p}$ corresponding to a secondary peak of magnetic permeability $\mu$ at the frequency of 0.5 MHz. The results are shown in Table 2.

As shown in Table 2, the toroidal sample exhibits the specific resistivity of 0.45$\Omega$.cm measured in the form of a wafer, the saturated magnetic flux density $B_{10}$ of 4,800G, the initial magnetic permeability $\mu i$ of 550 at the frequency of 7 MHz, and the temperature $T_{\mu 2p}$ of 10° C.

Figure 2:
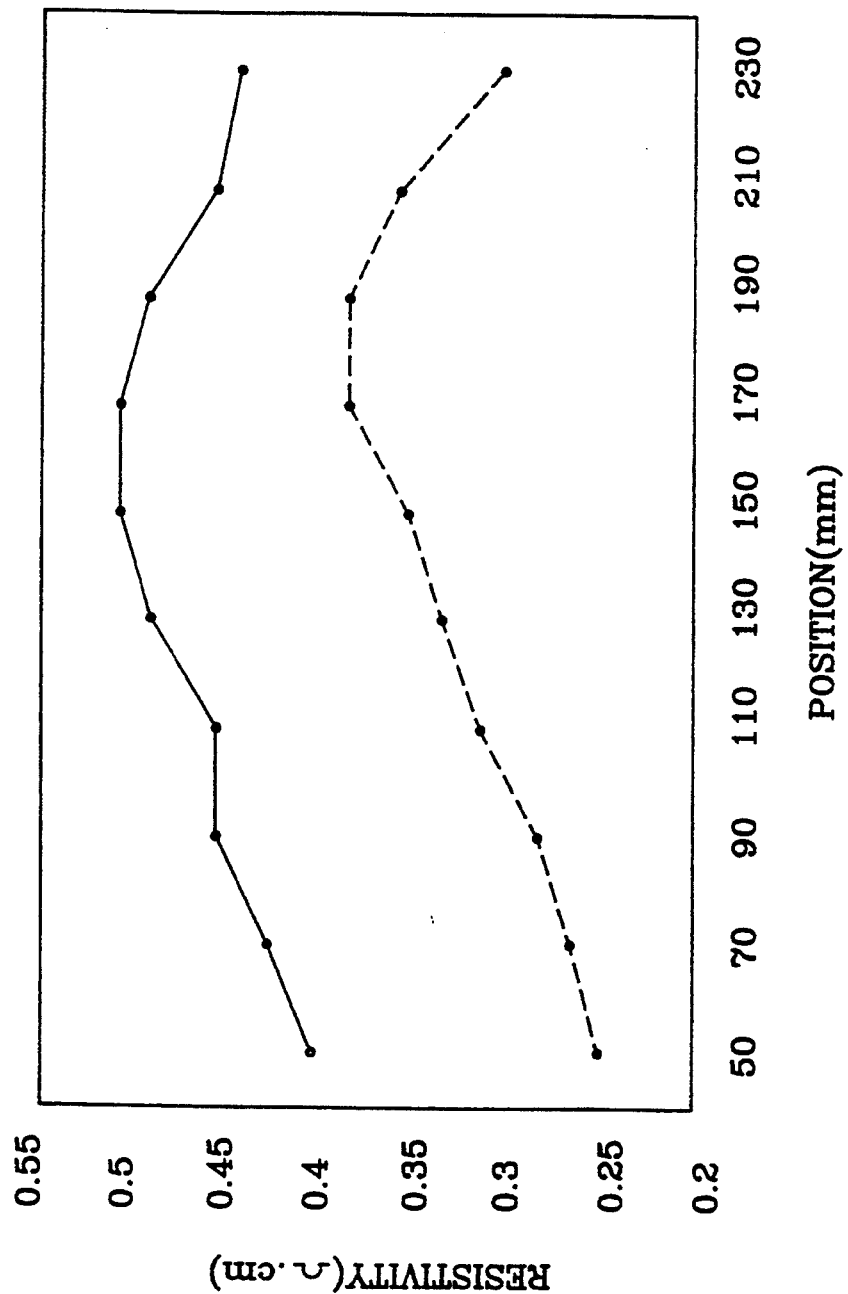
FIG. 2 is a graph illustrating a relation between the specific resistivity of a wafer and the position of an ingot from which the wafer is obtained.

FIG. 2 is a graph illustrating a relation between the specific resistivity of a wafer and the position of an ingot from which the wafer is obtained. At ingot positions between 50 mm and 230 mm, the wafer of the present invention exhibits the specific resistivity of 0.4 to 0.5$\Omega$.cm, as indicated by the solid line in FIG. 2, whereas the wafer of the prior art exhibits the specific resistivity of 0.25 to 0.38$\Omega$.cm, as indicated by the phantom line in FIG. 2.

In particular, the wafer of the present invention exhibits the specific resistivity of 0.45$\Omega$.cm at the ingot position of 110 mm. At the same ingot position, the wafer of the prior art exhibits the specific resistivity of 0.32$\Omega$.cm.

Figure 3:
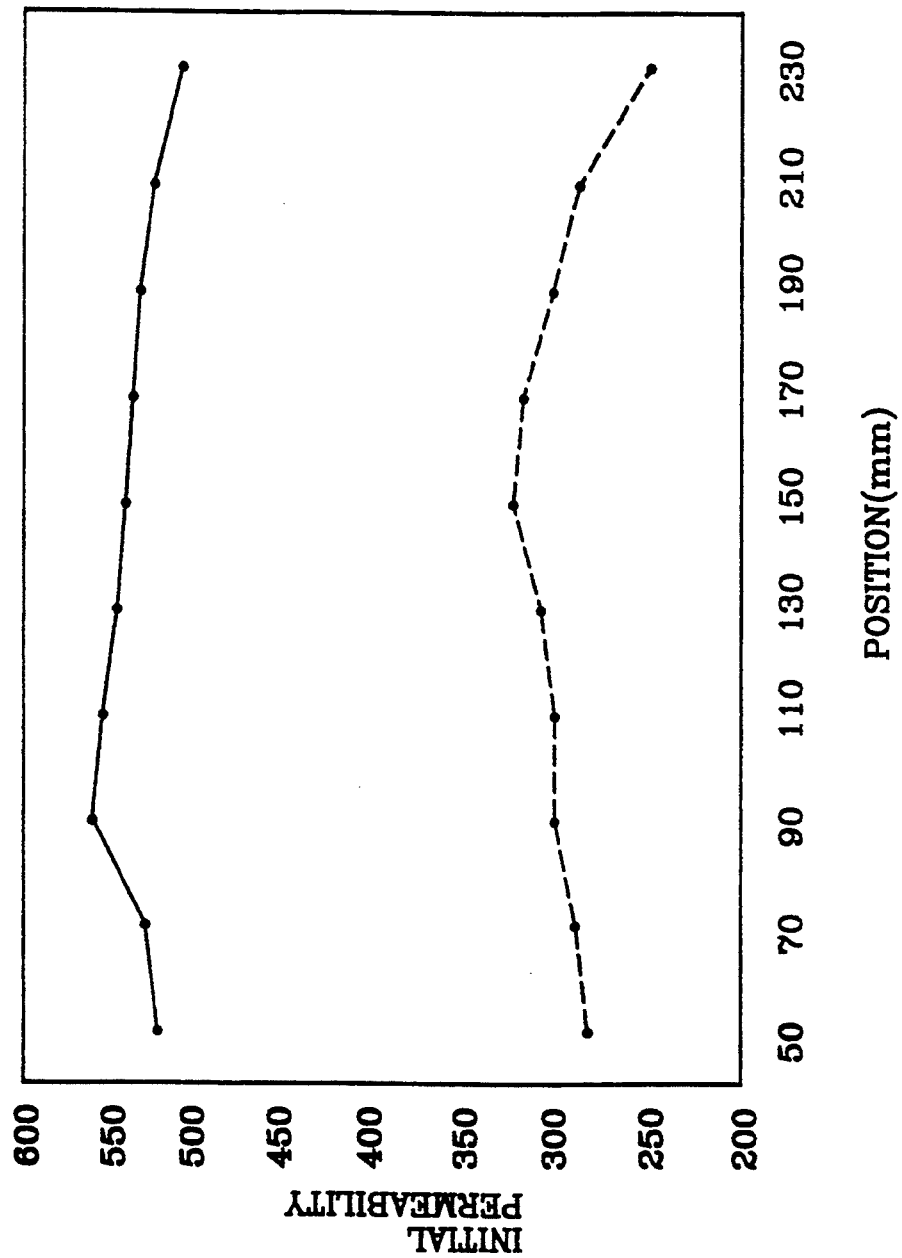
FIG. 3 is a graph illustrating a relation between the initial magnetic permeability $\mu i$ of a toroidal sample and the position of an ingot from which the toroidal sample is obtained.

FIG. 3 is a graph illustrating a relation between the initial magnetic permeability $\mu i$ of a toroidal sample and the position of an ingot from which the toroidal sample is obtained. At ingot positions between 50 mm and 230 mm, the toroidal sample of the present invention exhibits the initial magnetic permeability $\mu i$ ranged from 500 to 560, as indicated by the solid line in FIG. 3, whereas the toroidal sample of the prior art exhibits the initial magnetic permeability $\mu i$ ranged from 250 to 330, as indicated by the phantom line in FIG. 3.

In particular, the toroidal sample of the present invention exhibits the initial magnetic permeability $\mu i$ of 550 at the ingot position of 110 mm. At the same ingot position, the toroidal sample of the prior art exhibits the initial magnetic permeability $\mu i$ of 300.

Figure 4:
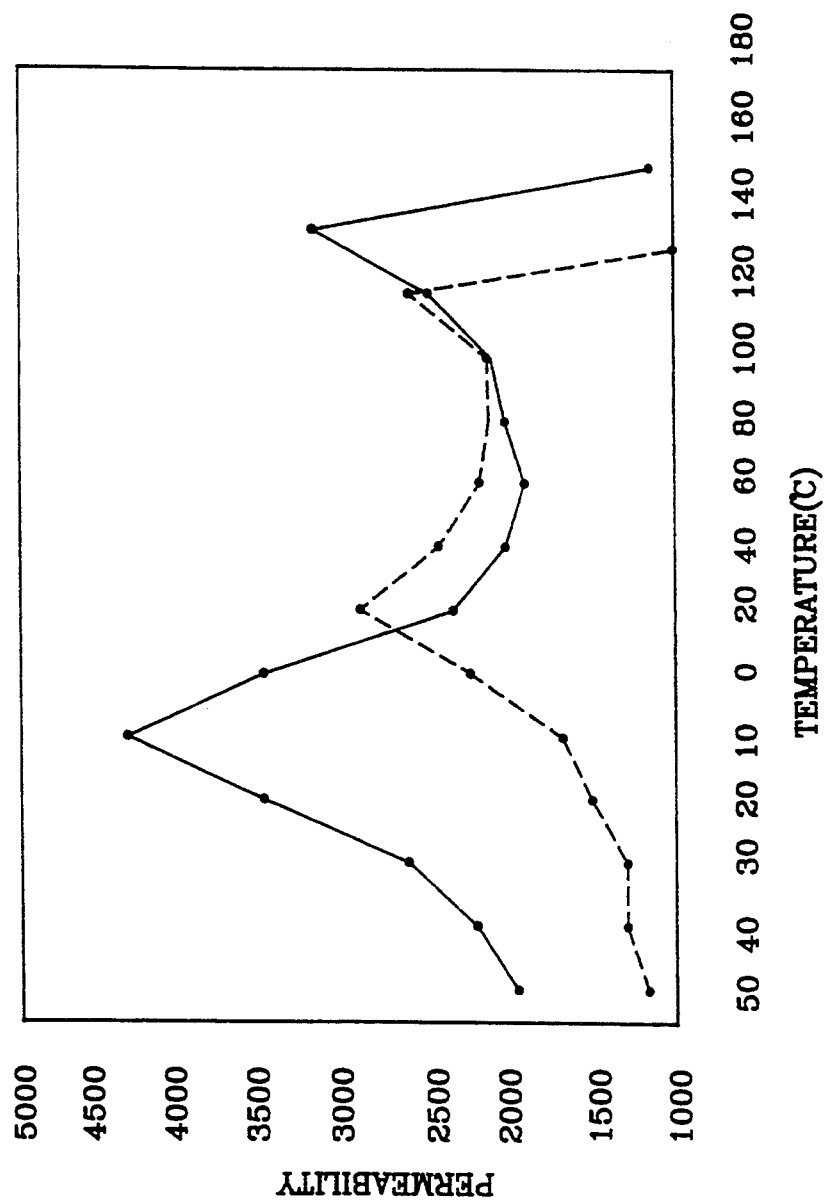
FIG. 4 is a graph illustrating a variation in magnetic permeability $\mu$ of a toroidal sample depending on the temperature measured.
Figure 5:
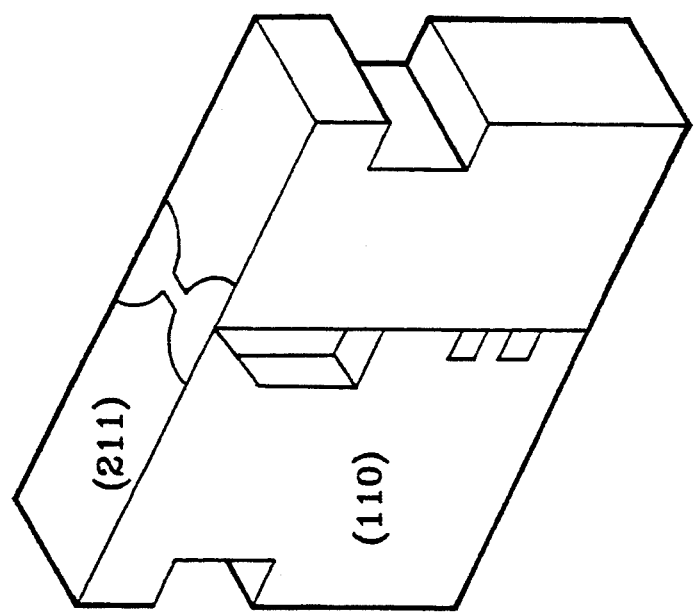
FIG. 5 is a perspective view schematically illustrating a general construction of a magnetic head for recording and reproducing images.

FIG. 4 is a graph illustrating a variation in magnetic permeability $\mu$ of a toroidal sample depending on the temperature measured. At the temperature of $-50°$ to $160°$ C., the toroidal sample of the present invention exhibits the permeability of 4,300 at $-10°$ C. and 3,200 at $140°$ C., as indicated by the solid line in FIG. 4, whereas the toroidal sample of the prior art exhibits the permeability of 2,800 at $20°$ C. and 2,550 at $120°$ C., as indicated by the phantom line in FIG. 4.

In particular, the temperature corresponding to the secondary peak of the magnetic permeability in the toroidal sample of the present invention is lower than that in the toroidal sample of the prior art. That is, the temperature is $-10°$ C. in the case of the present invention and $20°$ C. in the case of the prior art.

At a third step $S_{13}$, the same procedures as those of the ninth step $S_9$ and the tenth step $S_{10}$ of the conventional method were carried out so as to manufacture a magnetic head and then measure the performance of the magnetic head. The results of the measurement are shown in Table 2.

As shown in Table 2, the magnetic head of the present invention exhibits the reproduction output of 280 $\mu V$ and the rubbing noise of 2 dB.

EXAMPLE 2

In this example, the same procedures as those in Example 1 are carried out, except that a different additive material composition essentially consisting of 1.0 mole % $SnO_2$, 0.5 mole % CoO, 0.5 mole % $CaCO_3$ and 0.5 weight % $V_2O_5$ was added in the same host material essentially consisting of 53 mole % $Fe_2O_3$, 28 mole % MnO and 19 mole % ZnO.

As shown in Table 3, a toroidal sample obtained in Example 2 exhibits the specific resistivity of $0.55\Omega.cm$ measured in the form of a wafer, the saturated magnetic flux density $B_{10}$ of 4,600G, the initial magnetic permeability $\mu i$ of 500 at the frequency of 7 MHz, and the temperature $T_{\mu 2p}$ of $-30°$ C. A magnetic head manufactured from the toroidal sample exhibits the reproduction output of 270 $\mu V$ and the rubbing noise of 1.5 dB.

EXAMPLE 3

In this example, the same procedures as those in Example 1 are carried out, except that a different additive material composition essentially consisting of 2.0 mole % $SnO_2$, 1.0 mole % CoO, 1.0 mole % $CaCO_3$ and 1.0 weight % $V_2O_5$ was added in the same host material essentially consisting of 53 mole % $Fe_2O_3$, 28 mole % MnO and 19 mole % ZnO.

As shown in Table 3, a toroidal sample obtained in Example 3 exhibits the specific resistivity of $0.6\Omega.cm$ measured in the form of a wafer, the saturated magnetic flux density $B_{10}$ of 4,500G, the initial magnetic permeability $\mu i$ of 400 at the frequency of 7 MHz, and the temperature $T_{\mu 2p}$ of $-40°$ C. A magnetic head manufactured from the toroidal sample exhibits the reproduction output of 240 $\mu V$ and the rubbing noise of 1.5 dB.

COMPARATIVE EXAMPLE 1

In this comparative example, the same procedures as those in Example 1 are carried out, except that a different additive material composition essentially consisting of 0.1 mole % $SnO_2$, 0.05 mole % CoO, 0.1 mole % $CaCO_3$ and 0.01 weight % $V_2O_5$ was added in the same host material essentially consisting of 53 mole % $Fe_2O_3$, 28 mole % MnO and 19 mole % ZnO.

As shown in Table 3, a toroidal sample obtained in Comparative Example 1 exhibits the specific resistivity of $0.35\Omega.cm$ measured in the form of a wafer, the saturated magnetic flux density $B_{10}$ of 5,000G, the initial magnetic permeability $\mu i$ of 330 at the frequency of 7 MHz, and the temperature $T_{\mu 2p}$ of $10°$ C. A magnetic head manufactured from the toroidal sample exhibits the reproduction output of 210 $\mu V$ and the rubbing noise of 5 dB.

COMPARATIVE EXAMPLE 2

In this comparative example, the same procedures as those in Example 1 are carried out, except that a different additive material composition essentially consisting of 2.5 mole % $SnO_2$, 1.5 mole % CoO, 1.5 mole % $CaCO_3$ and 1.5 weight % $V_2O_5$ was added in the same host material essentially consisting of 53 mole % $Fe_2O_3$, 28 mole % MnO and 19 mole % ZnO.

As shown in Table 3, a toroidal sample obtained in Comparative Example 2 exhibits the specific resistivity of $0.75\Omega.cm$ measured in the form of a wafer, the saturated magnetic flux density $B_{10}$ of 4,200G, the initial magnetic permeability $\mu i$ of 330 at the frequency of 7 MHz, and the temperature $T_{\mu 2p}$ of $-60°$ C. A magnetic head manufactured from the toroidal sample exhibits the reproduction output of 190 $\mu V$ and the rubbing noise of 4.5 dB.

From the above description, it can be understood that where an Mn-Zn-based single crystal ferrite composition contains an additive material essentially consisting of 0.2 to 2 mole % $SnO_2$, 0.1 to 1 mole % CoO, 0.2 to 1 mole % $CaCO_3$ and 0.02 to 1 weight % $V_2O_5$ added to a host material essentially consisting of 51 to 54 mole % $Fe_2O_3$, 27 to 33 mole % MnO and 16 to 20 mole % ZnO, a magnetic head manufactured from the single crystal ferrite generates an enhanced reproduction output and a reduced rubbing noise, thereby achieving a high picture quality and a high resolution of images.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

TABLE 1

| Chemical Composition (mole %) | | |
|---|---|---|
| $Fe_2O_3$ | MnO | ZnO |
| 51–54 | 27–33 | 16–20 |

| Properties | | | | |
|---|---|---|---|---|
| $B_{10}$ (G) | $\mu i$ | $T_{\mu 2p}$ (°C.) | Reproduction Output ($\mu V$) | Rubbing Noise (dB) |
| 4,200–5,000 | 200–330 | 0–50 | 170–220 | 5–8 |

TABLE 2

| Sample | Basic Composition | $SnO_2$ | CoO | $CaCO_3$ | $V_2O_5$ [wt %] |
|---|---|---|---|---|---|
| Present Invention | 53/28/19 | 0.5 | 0.5 | 0.5 | 0.02 |
| Prior Art | 53/28/19 | — | — | — | — |

| Res. ($\Omega \cdot cm$) | $B_{10}$ (G) | $\mu i$ | $T_{\mu 2p}$ (°C) | Reproduction Output ($\mu V$) | Rubbing Noise (dB) |
|---|---|---|---|---|---|
| 0.45 | 4,800 | 550 | −10 | 280 | 2 |
| 0.32 | 4,900 | 300 | 20 | 190 | 6 |

TABLE 3

| Sample | Basic Composition | $SnO_2$ | CoO | $CaCO_3$ | $V_2O_5$ [wt %] |
|---|---|---|---|---|---|
| Example 1 | 53/28/19 | 0.5 | 0.5 | 0.5 | 0.02 |
| Example 2 | 53/28/19 | 1.0 | 0.5 | 0.5 | 0.5 |
| Example 3 | 53/28/19 | 2.0 | 1.0 | 1.0 | 1.0 |
| Comp. Example 1 | 53/28/19 | 0.1 | 0.05 | 0.1 | 0.01 |
| Comp. Example 2 | 53/28/19 | 2.5 | 1.5 | 1.5 | 1.5 |

| Sample | Res. ($\Omega \cdot cm$) | $B_{10}$ (G) | $\mu i$ | $T_{\mu 2p}$ (°C) | Rep. Output ($\mu V$) | Rub. Noise (dB) |
|---|---|---|---|---|---|---|
| Example 1 | 0.45 | 4,800 | 550 | −10 | 280 | 2 |
| Example 2 | 0.55 | 4,600 | 550 | −30 | 270 | 1.5 |
| Example 3 | 0.6 | 4,500 | 400 | −40 | 240 | 1.5 |
| Comp. Example 1 | 0.35 | 5,000 | 330 | 10 | 210 | 5 |
| Comp. Example 2 | 0.75 | 4,200 | 300 | −60 | 190 | 4.5 |

What is claimed is:

1. A Mn-Zn-based single crystal ferrite grown from a sintered mixture of a host material essentially consisting of 51 to 54 mole % $Fe_2O_3$, 27 to 33 mole % MnO and 16 to 20 mole % ZnO, and an additive material essentially consisting of 0.2 to 2 mole % $SnO_2$, 0.1 to 1 mole % CoO, 0.2 to 1 mole % $CaCO_3$ and 0.02 to 1 weight % $V_2O_5$.

* * * * *